TRANSISTOR STABILIZED OSCILLATOR WITH TAPPED COIL

Filed May 18, 1962

TYPICAL EFFECT OF
BUILD OUT CAPACITANCE

*INVENTORS*
R. C. TAYLOR
F. L. O'BRIEN

*BY*

Eli Weiss

*ATTORNEY*

United States Patent Office 3,251,005

Patented May 10, 1966

3,251,005

TRANSISTOR STABILIZED OSCILLATOR WITH TAPPED COIL

Roland C. Taylor, Ridgewood, and Fred L. O'Brien, Rutherford, N.J., assignors to The Western Union Telegraph Company, New York, N.Y., a corporation of New York Filed May 18, 1962, Ser. No. 195,828
2 Claims. (Cl. 331—109)

This invention relates generally to an oscillator network and more particularly to a superior multi-frequency oscillator network which has extraordinarily stable characteristics.

It is an object of this invention to provide a multi-frequency oscillator network which employs a tapped inductance coil and a capacitor to determine frequency of oscillation, and cross coupled transistor amplifiers to maintain stability of oscillation frequency.

It is another object of this invention to provide a multi-frequency oscillator network which includes an inductance-capacitance circuit determining frequency of oscillation of the network, and two transistor amplifiers arranged for linear amplification and connected in two feedback loops to the inductance-capacitance circuit to maintain stability of oscillation frequency.

It is still another object of this invention to provide a multi-frequency oscillator network which has a frequency determining inductance-capacitance circuit including a tapped coil with a determinable distributed capacitance.

It is an additional object of this invention to provide a multi-frequency oscillator network wherein the signals generated are practically free of frequency deviation at all frequencies.

It is also another object of this invention to provide a multi-frequency oscillator network which is reliable in operation and economical to build.

Figure 1:
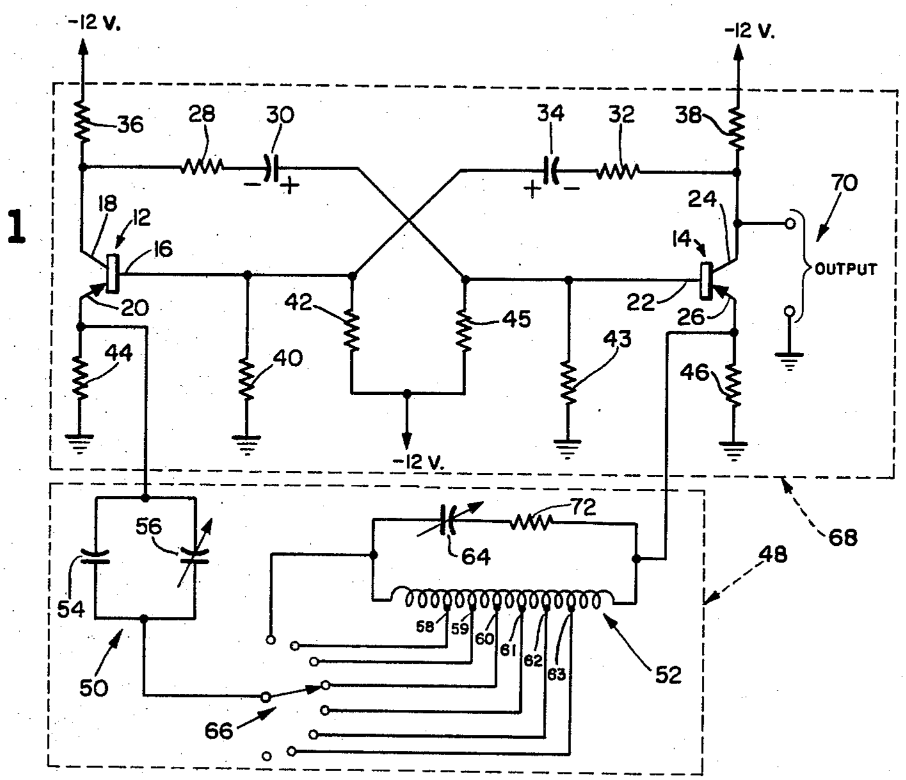
Figure 2:
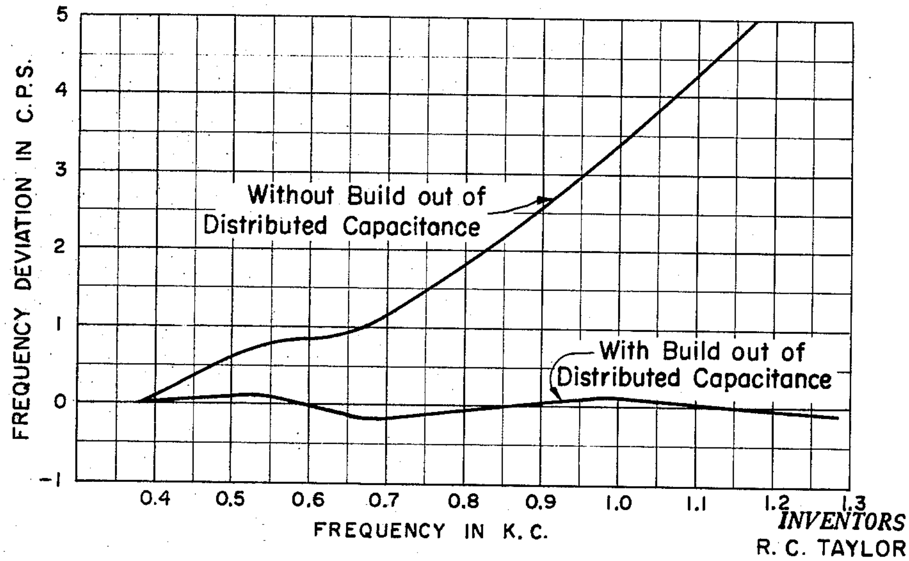

Other objects and many of the attendant advantages of this invention will be readily appreciated as the apparatus becomes better understood by reference to the following detailed description when considered in connection with the accompanying drawings wherein:

FIG. 1 is a schematic diagram in accordance with the principles of this invention; and FIG. 2 is a graph of the frequency of the signal generated when the coil of the frequency determining inductance-capacitance circuit is modified in accordance with the principles of this invention, as compared with the frequency of the signals generated when an unmodified coil is used in the inductance-capacitance circuit.

In the oscillator of the present invention, two solid state amplifier devices, namely junction p-n-p transistors, are connected in a closed loop fashion with cross-coupling between the collector of each transistor and the base of the conjugate transistor. Each transistor constitutes an amplifier stage which is D.C. biased for linear amplification. Unlike conventional amplifiers, each amplifier stage contains a relatively large emitter resistor without any A.C. by-pass capacitors. These emitter resistors provide degeneration preventing positive feedback provided by the cross-coupling loop from sustaining relaxation oscillations.

Each cross-coupled loop contains a series resistance-capacitance circuit which allows A.C. coupling but prevents D.C. coupling. Also this enables each transistor to be D.C. biased separately.

The present arrangement also includes coupling between the two emitters. This coupling acts over a definite frequency range as a second feedback path between the two transistors to provide additional positive feedback and also to limit the degenerative effect of the emitter resistors by providing a low impedance shunt path between both emitters at the operating frequency. At this operating frequency, the two feedback paths or loops that exist prove to be sufficient for sustaining oscillations. The frequency of operation is determined from conditions that make the loop gain greater than or substantially equal to unity in accordance with the Barkhaussen law for sustained oscillations in an oscillator. Thus it is sufficient to say that the basic condition is for the coupling between the emitters to be of low impedance. Since this coupling is a series resonant tapped inductance and capacitance circuit, the frequency of operation is determined by the capacitance and the particular inductance value tapped. There is thus provided facility for multiple or adjustable frequency of operation by appropriate selection of inductance tap.

High stability in frequency is attained because either side of the coupled inductance-capacitance circuit sees a low impedance load due to an emitter follower effect presented looking into the emitter of each transistor. Greater measure of control is effected by the use of two separate feedback loops. Each emitter feedback loop acts as a control on the total loop gain and thus controls frequency of operation determined by the inductance-capacitance circuit.

When a frequency determining inductance-capacitance circuit for an oscillator network is designed, in which the circuit includes a wound coil and associated wiring, the designer must consider and allow for the ever present distributed capacitance that is attributable to the coil and the associated wiring. This capacitance operates as a shunt capacitance across the coil. Unfortunately, however, the design can only be approximate as the value of the distributed capacitance of a coil and its wiring can not be predicted accurately. It is not uncommon to have the distributed capacitance of coils manufactured to the same specification to vary substantially from each other. The distributed capacitance of a coil is determined by many factors such as the thickness of wire insulation, the thickness of paper between the layers of wire, the amount of tension applied to the wire when winding the coil, and the like. Obviously, when mass producing coils, it is virtually impossible to provide coils each of which has the very same value of distributed capacitance.

The structure of this invention enables each mass produced coil to present the exact same value of total effective shunt capacitance.

Very briefly, this is accomplished by coupling a small capacitor across the terminals of the coil, the value of the external capacitor and the value of the distributed capacitance being equal to the total value of effective shunt capacitance desired. Naturally, the value of the external capacitor will not be exactly the same for each coil and, therefore, it would probably be advisable to use an external capacitor that is adjustable.

With this invention, the effective shunt capacitance of a coil can be increased to a desired value. However, it can not be decreased. Therefore, the total shunt capacitance of a coil, assumed for design purpose should always have a value larger than the largest value of distributed capacitance present, and the external capacitance is used to increase the value of the distrilbuted capacitance to the value assumed.

With reference to FIG. 1 there is disclosed in accordance with the principles of this invention a frequency determining series resonant inductance-capacitance circuit 48 including a tapped coil 52 in series with a fixed capacitor 54. The series resonant circuit is connected between emitter terminals of two transistor amplifiers 12, 14. A capacitor 64 is connected in shunt with tapped coil 52 to provide desired compensation for distributed capacitance in the coil and associated wiring. Resistor 72 in series with capacitor 64 serves as a damping means for spurious frequencies caused by resonance in the L-C circuit 52, 56. A trimmer capacitor 56 can be connected across capacitor 54 to constitute a single lumped capacitance 50 in the frequency determining series resonant circuit 48.

Transistor 12 has a base 16, a collector terminal 18, and an emitter 20. Transistor 14 has a base terminal 22, a collector 24, and an emitter 26. A resistor 28 in series with a capacitor 30 is connected between collector 18 of transistor 12 and base 22 of transistor 14 in a first feedback loop. A resistor 32 in series with a capacitor 34 is connected between the collector 24 of transistor 14 and the base 16 of transistor 12 in a second feedback loop. A source of potential supplies negative direct current (D.C.) twelve volts through a resistor 36 to the collector 18 of transistor 12, and also supplies negative direct current (D.C.) twelve volts through a resistor 38 to the collector 24 of transistor 14. The base 16 of transistor 12 is coupled through a resistor 40 to ground and through resistor 42 to the negative twelve volts source of potential. The base terminal 22 of transistor 14 is coupled through resistor 43 to a ground and through resistor 45 to the negative twelve volts source of potential. The resistors 40, 43 determine the base bias and, therefore operating point of the two transistors. The emitter 20 of transistor 12 is coupled through a resistor 44 to ground, and emitter 26 of transistor 14 is coupled through resistor 46 to ground. Resistors 44 and 46 are connected between the emitters 20 and 26 to provide degeneration and prevent positive feedback provided by the cross coupling loops from sustaining relaxation oscillations. Each cross coupled loop contains a series resistance-capacitance circuit 28, 30 and 32, 34 which allows alternating current coupling while preventing direct current coupling between transistors. Thus the transistors can be D.C. biased separately and independently.

The coil 52 has a plurality of tap terminals 58, 59, 60, 61, 62, and 63 coupled in shunt with a small trimmer capacitor 64. The trimmer capacitor 64 is adjusted to add the required capacitance necessary to provide a coil with a particular total value of distributed capacitance. Thus, the trimmer capacitor compensates for wiring capacitances in addition to variations in the coils. In practice this is accomplished by allowing for an excess of distributed capacitance when the tap terminals are chosen during the time of design and then by adjusting the compensating means or trimmer capacitor 64 during final construction to provide the additional capacitance necessary to realize the design objective.

The capacitor circuit 50 is coupled selectively to the tap terminals of the inductor coil 52 by a switch 66. To vary the resonant frequency of the series resonant circuit 48 the inductance of the inductor coil 52 is changed by coupling the capacitor 50 to a new tap terminal of the inductor coil 52, the capacitance value of the capacitor circuit 50 remaining unchanged.

With reference to FIG. 2, there is disclosed a graph of the frequency of the signal generated when the compensating means 64 is present and another graph of the frequency of the signal generated when the compensating means 64 is not present. It should be noticed that when an oscillator coil which did not have a shunt capacitance compensating means was used in the series resonant circuit 48 the deviation of signal frequency increased gradually with increase in signal frequency to slightly over six cycles at 1200 cycles per second. However, the addition of a single capacitor 64 coupled in shunt with the coil to bring the distributed capacitance of a mass produced coil up to design specifications reduced the frequency deviation to a random amount of plus or minus two tenths of a cycle per second. This residual could be associated with turn errors of about five hundredths of a turn.

It will be apparent that the series resonant cicruit 48 has two main frequency determining components, the fixed capacitor 54 and the tapped inductor coil 52. The series resonant frequency is determined by the tap on coil to which switch 66 is set. The two transistors 12 and 14 are arranged as linear amplifiers which are cross coupled for alternating current only by two feedback loops. These amplifiers compensate for energy losses in the series resonant circuit 48 and thus serve to sustain oscillations. In addition, they stabilize and control the frequency of oscillation of the circuit 48 without determining or varying the frequency in any way. As a result, at the output terminals 70 of the network appears oscillations of fixed frequency having substantially pure sine waveform.

It will be noted that any tendency for oscillations to develop in the cross coupled loops is damped out by the high resistances 44, 46. In addition the resonant circuit 48 sees very low impedance at both ends where it is connected to emitters 20, 26. This light loading of the resonant circuit is an important factor contributing to the sustained, undistorted sine waveform output of the oscillator network.

Obviously, many modifications and variations of the present invention are possible in the light of the above teachings. It is therefore to be understood that within the scope of the appended claims the invention may be practiced otherwise than as specifically described.

What is claimed is:

1. An oscillator network, comprising:

a capacitor;

a coil connected in a series resonant circuit with said capacitor so that said circuit oscillates at a predetermined frequency;

a first transistor having a base, emitter and collector;

a second transistor having another base, emitter and collector;

a first non-resonant feedback loop circuit connected between the collector of the first transistor and the base of the second transistor;

a second non-resonant feedback loop circuit connected between the collector of the second transistor and the base of the first transistor;

means directly connecting the emitter of one of the transistor to said coil at one terminal of said series resonant circuit;

means directly connecting the emitter of the remaining transistor to said capacitor at another terminal of said series resonant circuit;

means for applying bias voltage between the base and emitter of each transistor;

a pair of network output terminals;

resistive circuit means connecting the emitters of the transistors to one output terminal; and circuit means directly connecting the collector of said one transistor to the other output terminal, whereby a sinusoidal alternating voltage whose frequency is determined only by said resonant circuit is continuously produced at said network output terminals, while each transistor serves only as a linear amplifier for pulses fed back via each of the loop circuits to the series resonant circuit to maintain the amplitude of oscillations of said series resonant circuit at constant amplitude;

said coil having a plurality of taps at predetermined points thereon, and a multiple position switch connected between said taps and the first named capacitor, whereby different resonant frequencies of said series resonant circuit are determined by the positions of said switch at said taps respectively so that alternating voltages of different frequencies are selectively produced at said network output terminals.

2. An oscillator network, comprising:

a capacitor;

a coil connected in a series resonant circuit with said capacitor so that said circuit oscillates at a predetermined frequency;

a first transistor having a base, emitter and collector;

a second transistor having another base, emitter and collector;

a first non-resonant feedback loop circuit connected between the collector of the first transistor and the base of the second transistor;

a second non-resonant feedback loop circuit connected between the collector of the second transistor and the base of the first transistor;

means directly connecting the emitter of one of the transistors to said coil at one terminal of said series resonant circuit;

means directly connecting the emitter of the remaining transistor to said capacitor at another terminal of said series resonant circuit;

means for applying bias voltage between the base and emitter of each transistor;

a pair of network output terminals;

resistive circuit means connecting the emitters of the transistors to one output terminal; and circuit means directly connecting the collector of said one transistor to the other output terminal, whereby a sinusoidal alternating voltage whose frequency is determined only by said resonant circuit is continuously produced at said network output terminals while each transistor serves only as a linear amplifier for pulses fed back via each of the loop circuits to the series resonant circuit to maintain the amplitude of oscillations of said series resonant circuit at constant amplitude;

said coil having a plurality of taps at predetermined points thereon; and a multiple position switch connected between said taps and the first named capacitor, whereby different resonant frequencies of said series resonant circuit are determined by the position of said switch at said taps respectively, so that alternating voltages of different frequencies are selectively produced at said network output terminals; and a variable capacitor connected across said coil to compensate for distributed capacitance in said coil, so that said series resonant circuit oscillates only at said predetermined frequency.

References Cited by the Examiner

UNITED STATES PATENTS

| | | | |
|---|---|---|---|
| 1,989,487 | 1/1935 | Green et al. | 331—105 X |
| 2,070,647 | 2/1937 | Braaten | 331—144 |
| 2,553,165 | 5/1951 | Bliss | 331—144 |
| 2,695,960 | 11/1954 | Harrison | 331—144 |
| 2,761,066 | 8/1956 | Robinson | 334—56 X |

FOREIGN PATENTS

| | | |
|---|---|---|
| 817,319 | 7/1959 | Great Britain. |

ROY LAKE, *Primary Examiner.*

JOHN KOMINSKI, *Examiner.*

J. B. MULLINS, *Assistant Examiner.*